(12) United States Patent
Adkisson et al.

(10) Patent No.: US 7,361,989 B1
(45) Date of Patent: Apr. 22, 2008

(54) STACKED IMAGER PACKAGE

(75) Inventors: James W. Adkisson, Jericho, VT (US);
Jeffrey P. Gambino, Westford, VT (US); Mark D. Jaffe, Shelburne, VT (US); Robert K. Leidy, Burlington, VT (US); Stephen E. Luce, Underhill, VT (US); Richard J. Rassel, Colchester, VT (US); Edmund J. Sprogis, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/528,227

(22) Filed: Sep. 26, 2006

(51) Int. Cl.
*H01L 23/48* (2006.01)

(52) U.S. Cl. ................. 257/737; 257/777; 257/778; 257/774

(58) Field of Classification Search .......... 257/778, 257/737, 738, 777, 774
See application file for complete search history.

(56) References Cited

U.S. PATENT DOCUMENTS

| | | | |
|---|---|---|---|
| 5,313,096 A * | 5/1994 | Eide | 257/686 |
| 5,716,759 A | 2/1998 | Badehi | 430/313 |
| 5,986,693 A | 11/1999 | Adair et al. | 348/76 |
| 6,022,758 A | 2/2000 | Badehi | 438/108 |
| 6,040,235 A | 3/2000 | Badehi | 438/464 |
| 6,633,335 B1 | 10/2003 | Kwon et al. | 348/308 |
| 6,646,289 B1 | 11/2003 | Badehi | 257/81 |
| 6,989,589 B2 | 1/2006 | Hammadou et al. | 257/685 |
| 2002/0074637 A1* | 6/2002 | McFarland | 257/686 |
| 2003/0197238 A1 | 10/2003 | Park | 257/446 |
| 2004/0095495 A1 | 5/2004 | Inokuma et al. | 348/308 |

OTHER PUBLICATIONS

Y. Bai, et al., entitled "Hybrid CMOS Focal Plane Array with Extended UV and NIR Response for Space Applications", Presented at SPIE's 48th Annual Meeting, Aug. 3-8, 2003, San Diego, California.

L. Kozlowski, et al., entitled "Low-Noise Monolithic and Hybrid CMOS-Based Sensors", Rockwell Scientific, Nov. 5, 2001.

* cited by examiner

*Primary Examiner*—Roy Potter
(74) *Attorney, Agent, or Firm*—John A. Jordan; William H. Steinberg (57) ABSTRACT

An imaging system for use in a digital camera or cell phone utilizes one chip for logic and one chip for image processing. The chips are interconnected using around-the-edge or through via conductors extending from bond pads on the active surface of the imaging chip to backside metallurgy on the imaging chip. The backside metallurgy of the imaging chip is connected to metallurgy on the active surface of the logic chip using an array of solder bumps in BGA fashion. The interconnection arrangement provides a CSP which matches the space constraints of a cell phone, for example. The arrangement also utilizes minimal wire lengths for reduced noise. Connection of the CSP to a carrier package may be either by conductive through vias or wire bonding. The CSP is such that the imaging chip may readily be mounted across an aperture in the wall of a cell phone, for example, so as to expose the light sensitive pixels on the active surface of said imaging chip to light.

11 Claims, 7 Drawing Sheets

STACKED IMAGER PACKAGE

BACKGROUND OF THE INVENTION

1. Field of the Invention

The present invention relates to small imaging packages and, more particularly, to the packaging of the semiconductor chips employed in the imaging systems of small imaging packages.

2. Background and Related Art

Imaging systems for hand held small equipment, such as, cell phones for example, typically employ image sensing materials in a CMOS chip arrangement. In such arrangements, the CMOS image sensor creates a picture by detecting signals from photodiodes and MOS transistors formed within unit pixels integrated into an array on a semiconductor chip arrangement.

In this regard, CMOS image sensor chip arrangements have allowed for the integration of logic and an imaging array on the same chip. This has been found beneficial in reducing the number of support chips needed in an imaging system, such as, a digital camera or a cell phone. Packaging requirements often make it difficult to place and wire multiple chips increasing the desire to have a total imaging solution on one chip.

However, recent development efforts have caused the amount of logic required to be placed on the same chip as the image sensor to significantly increase. For example, the amount of logic may now include logic circuits to implement image processing, such as, color correction, white balance, random and fixed pattern noise suppression, image compression, and camera functions, such as, lens motor controls for auto focus and zoom function, among other functions.

The fundamental process for creating a CMOS imaging array is compatible with digital logic, but not optimized for such. To create a high quality imaging array, the process needs to be optimized for low leakage. This typically means lengthy high temperature anneals and low doping levels in the diffusion processes. These processes tend to work against high performance, high density, logic. Thus, either the density and performance of the logic suffer, or the process has to be made much more complex, doubling the number of implants needed to make separate wells, and diffusions for the logic and for the imaging circuits.

There is also the problem of noise. High performance logic often creates noise both in the substrate and on the metal levels. This noise can degrade the image quality. Thus, there are a variety of reasons for using separate chips, one for imaging and one for logic.

Image display systems which have separate chips, one chip for logic and another chip for imaging, are known. For example, U.S. Patent Publication 2004/0095495 A1 describes one such arrangement. When using a two-chip approach to implementing imaging systems, various alternatives are available for allocating functions between the two chips. However, independent of how the functions are allocated between the chips, the arrangement and interconnection of the two chips in a small, rugged package within tight space constraints is critical. Moreover, although high performance logic chips continue to become smaller even with more functionality, the imaging chip with imaging array cannot be similarly reduced without loss of imaging capability. Thus, typically, the logic chip will be interconnected with a larger imaging chip. The ability to effectively interconnect the two chips to one another to in a chip scale package (CSP) and to interconnect the CSP to the carrier package in which the CSP is arranged, is an important consideration in fabricating, for example, a cell phone camera module in a cell phone package.

SUMMARY OF THE PRESENT INVENTION

It is, therefore, an object of the present invention to provide an improved imaging system packaging arrangement.

It is a further object of the present invention to provide a packaging arrangement for a two chip imaging system.

It is yet a further object of the present invention to provide an interconnection method and arrangement for interconnecting a pair of chips to one another and to the carrier package in which they operate.

It is another object of the present invention to provide an imaging system with interconnection arrangements between an imaging chip and a logic chip to form a CSP and between these chips in a CSP and the carrier package in which the CSP functions.

It is yet another object of the present invention to provide a packaging and interconnection arrangement for an imaging system employing a logic chip and imaging chip for use in a camera module for a cellular phone or the like.

It is still yet another object of the present invention to provide a CSP arrangement for an imaging system employing an imaging chip and a logic chip interconnected using around-the-edge or conductive vias connected to backside metallurgy and ball grid array (BGA) chip interconnections.

In accordance with the present invention, an imaging system, employed in a cell phone or digital camera, for example, utilizes one chip for logic and one chip for imaging. The logic chip is typically smaller than the imaging chip and is interconnected to the imaging chip through backside metallurgy on the imaging chip backside. Imaging chip active surface interconnection to the backside metallurgy is implemented two ways. One employs around-the-edge connections to bond pads on the active surface of the imaging chip. The other employs through vias to bond pads on the active surface. The chip interconnections are such as to create a CSP comprising an imaging chip and a logic chip.

Interconnection of the CSP to the carrier package may be implemented several ways. Where the logic chip acts as the mounting point for the CSP, an array of solder bumps on the backside of the logic chip acts to interconnect to the carrier package. This array of solder bumps is coupled by through vias to the active surface of the logic chip. This acts to minimize interconnect distance.

Where the imaging chip acts as the mounting point for the CSP, wire bonding is used to connect the CSP to the carrier package. This approach is used for both the around-the-edge and through vias wiring to the back side metallurgy. By mounting the imaging chip to the carrier package, such as, a cell phone housing wall, optical elements required for the imaging chip may readily be positioned and mounted in the aperture.

DETAILED DESCRIPTION OF THE DRAWINGS

Figure 1:
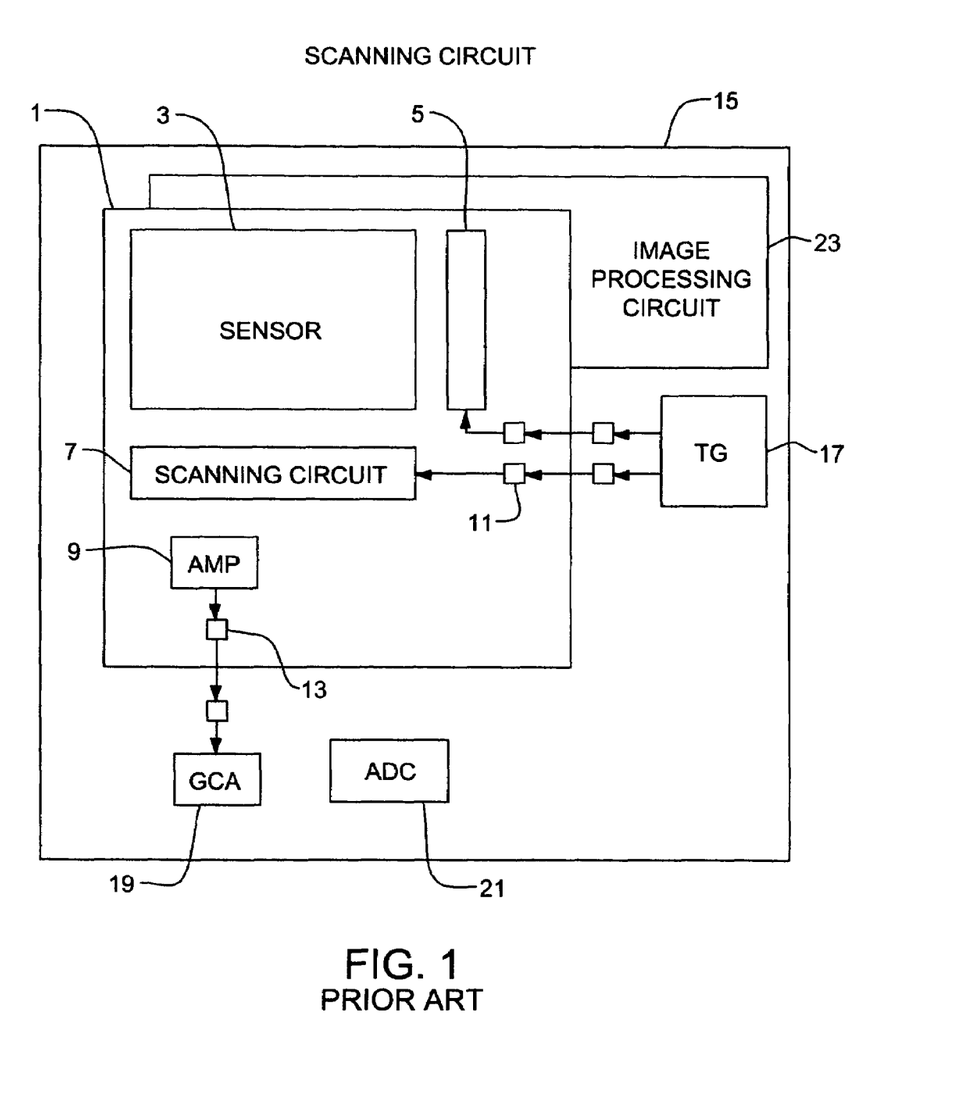
FIG. 1 shows a schematic view of a typical prior art imaging system.

FIG. 1 shows an example of a typical prior art imaging system employing an imaging chip and processing logic chip. In this particular example, imaging chip 1 includes image sensor 3 for converting light into an electric signal, horizontal and vertical scanning circuits 5 and 7 for driving sensor 3, and an amplifier 9 for amplifying the signals of sensor 3. Also included on imaging chip 1 is a timing pulse input terminal 11 and an image signal output terminal 13.

Imaging chip 1 is stacked on imaging processing chip 15. Image processing chip 15, in this example, includes timing generator 17, gain control amplifier (GCA) 19, analog/digital converter (ADC) 21 and imaging processing circuit 23. It is clear that in a two chip imaging system, some of the various functions required to operate can be arranged on either chip.

However, the logical processes required to operate the various functions, such as, image processing, should be placed on the logic chip. By so doing, the logic processes can be optimized separately from the imaging processes, thereby preserving both high quality images and high speed, high density logic which is noise isolated from the imaging array. Image processing may include, among other operations, color correction, white balance, random and fixed pattern noise suppression and image compression. Digital camera equipment may also include camera functions, such as, lens motor control for auto focus and zoom control.

Thus, the description of prior art image processing chip 15 of FIG. 1 does not include functions, such as, lens motor control and zoom control, or image processing, such as color connection, white balance, noise suppression and image compression. Where such functions are employed, they would all be included on the logic chip. In addition, there may be a variety of other features for camera applications that would also be included in the logic chip.

Figure 2A:
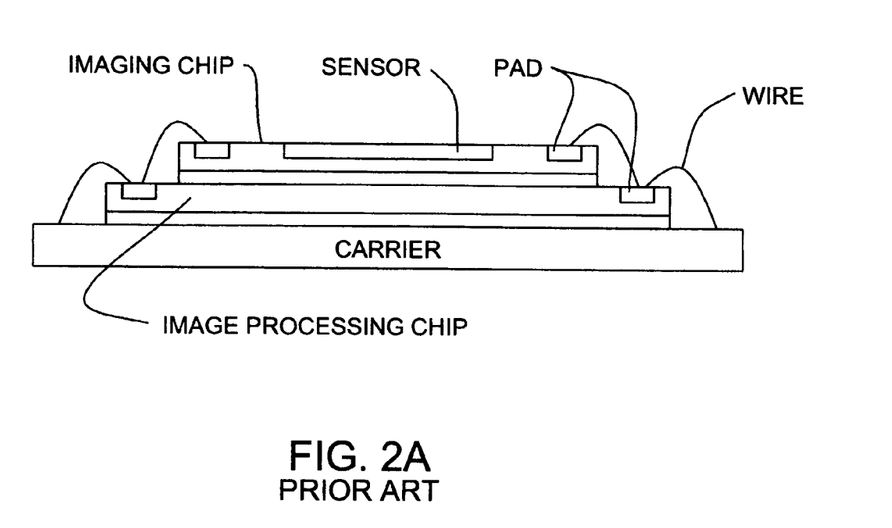
FIGS. 2A and 2B show a typical prior art imaging system employing an imaging chip and a logic chip.
Figure 2B:
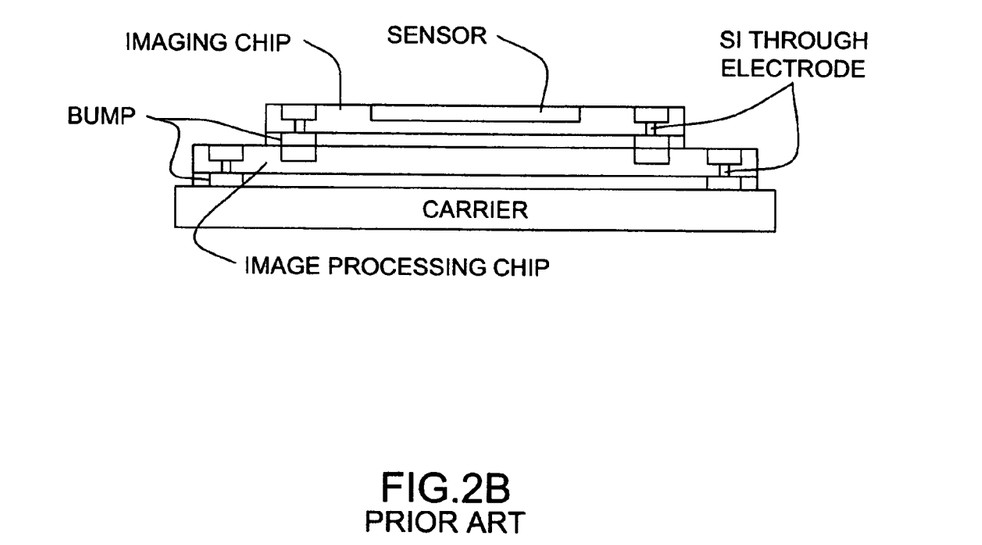

FIG. 2A shows one typical arrangement for interconnecting an imaging chip, an image processing or logic chip, and a carrier, stacked in that order. As shown, the interconnections are made using wire bonding. FIG. 2B shows the same stacking arrangement with the interconnections made using conductive through vias. As shown in FIG. 2A, wire bonding operates from one level to successive lower levels, each larger in footprint. As shown in FIG. 2B, the interconnecting through vias are positioned around the edge of the chips. In each of FIGS. 2A and 2B, the footprint of the image processing logic chip is larger than the imaging chip.

Figure 3:
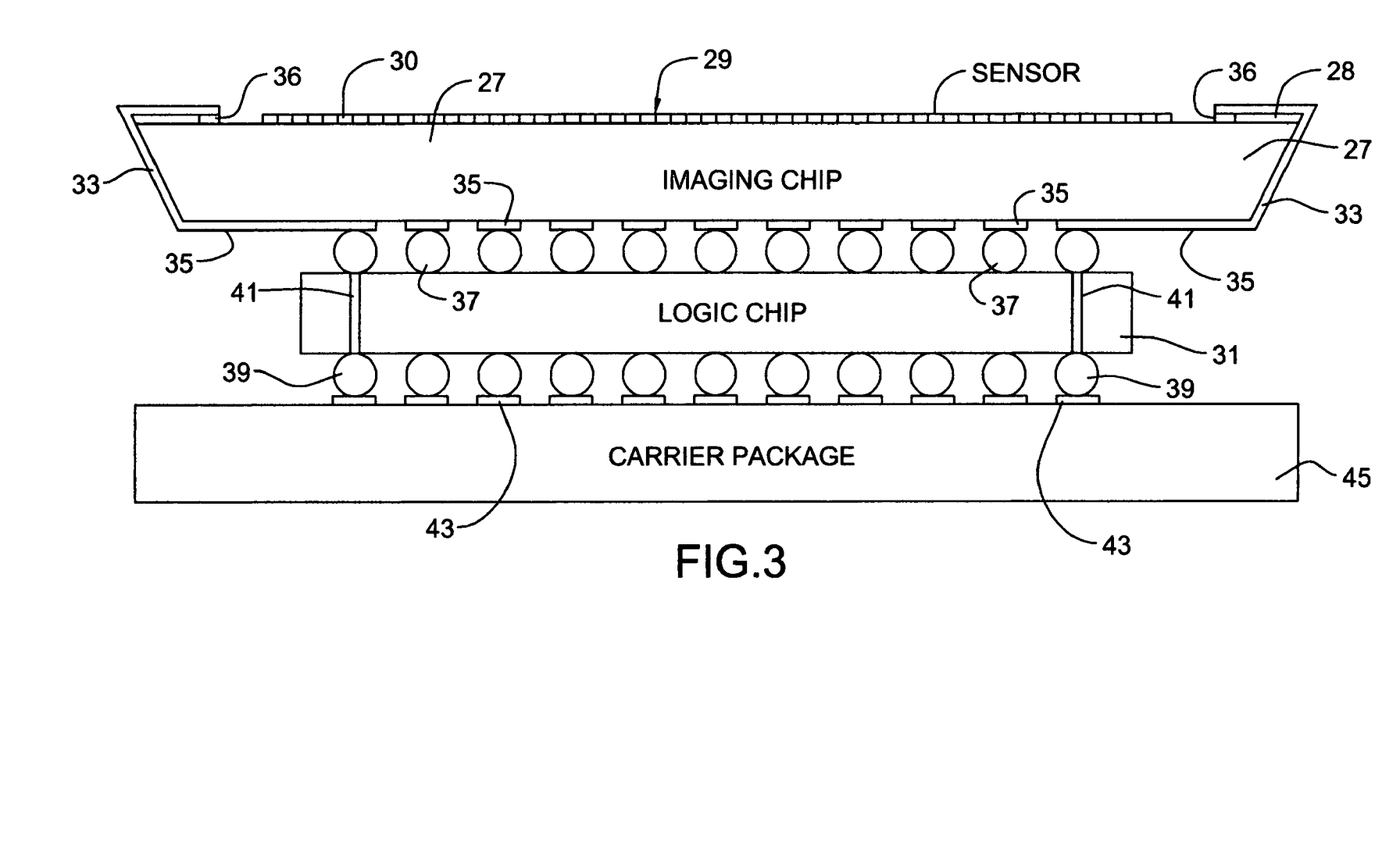
FIG. 3 shows a cross-section of one interconnection and packaging arrangement, in accordance with the present invention.

FIG. 3 shows, in accordance with the present invention, an interconnection and packaging arrangement using around edge wiring as, known in the art, and backside metallurgy for the imaging chip. Typical of such wiring and metallurgy is that described in U.S. Pat. No. 6,646,289 assigned to Shellcase Ltd. Such wiring arrangements are known for their compactness, mechanical integrity and environmentally protected packaging features.

Imaging chip 27 in FIG. 3 includes sensor layer 29. Sensor layer 29 typically comprises a pixel array of sensing elements 30 for converting light into electric signals. Imaging chip 27 is interconnected with logic chip 31 using around-the-edge connection metallurgy 33 connected to bond pads 36 on the active surface of the imaging chip and backside metallurgy 35 on the backside of the imaging chip. Insulating material 28 may separate the metallurgy from the active surface, as shown. Although not shown, insulating material may also be used to separate all of around-the-edge metallurgy from chip 27. Backside metallurgy 35 brings the signals from the imaging chip to solder bumps 37 of a solder bump array or BGA on logic chip 31.

Figure 4:
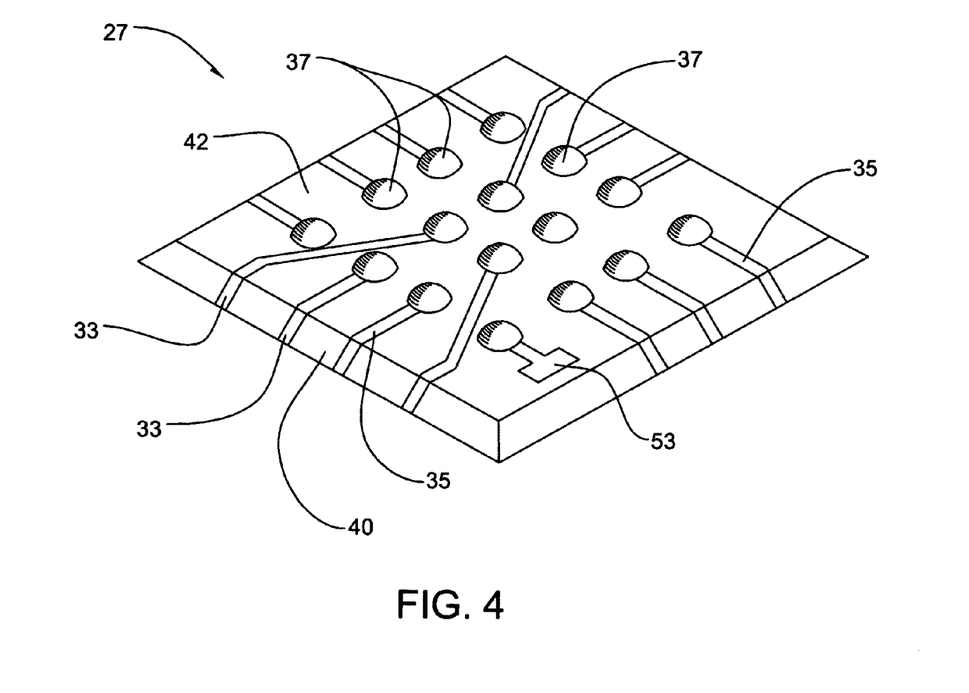
FIG. 4 shows a backside view of the imaging chip using around-the-edge wiring to an array of solder bumps.

FIG. 4 shows the backside 42 of imaging chip 27 in a typical backside pattern of metallurgy 35 connected to solder bumps 37. Around-the-edge metallurgy 33 on sloped surface 40 connects to bond pads (not shown) on the opposing (active) surface and to backside metallurgy 35 on backside 42. As shown, in FIGS. 3, 4 and 5, the around-the-edge metallurgy 33 is conformal to the chip edge, as is backside metallurgy 35 conformal to the backside of the chip.

Solder bumps 37 in FIG. 3 connect to solder bumps 39 on the backside of logic chip 31 by way of conductive through vias 41, two of which are shown. Solder bumps 39, in turn, connect to pads 43 on carrier package 45. Carrier package 45 may be a substrate, such as, a ceramic substrate which is mounted to the wall of a device package, such as, a cell phone or camera. Carrier package 45 may also be attached to other layers of material. Alternatively, the carrier package may be the wall of a cell phone itself, for example, with logic chip 31 then being attached to the wall with an adhesive.

It is understood that the cross-section of FIG. 3 shows two through vias and their location only by way of example. It is clear that there are others. These are shown to demonstrate that some signals from imaging chip 27 carry through to BGA's 39 on carrier package 45. Other signals to BGA's 39 come by way of vias from logic chip 31. The signals going to the carrier package may be for any of a variety of reasons, such as, various control functions, display, etc.

Figure 5:
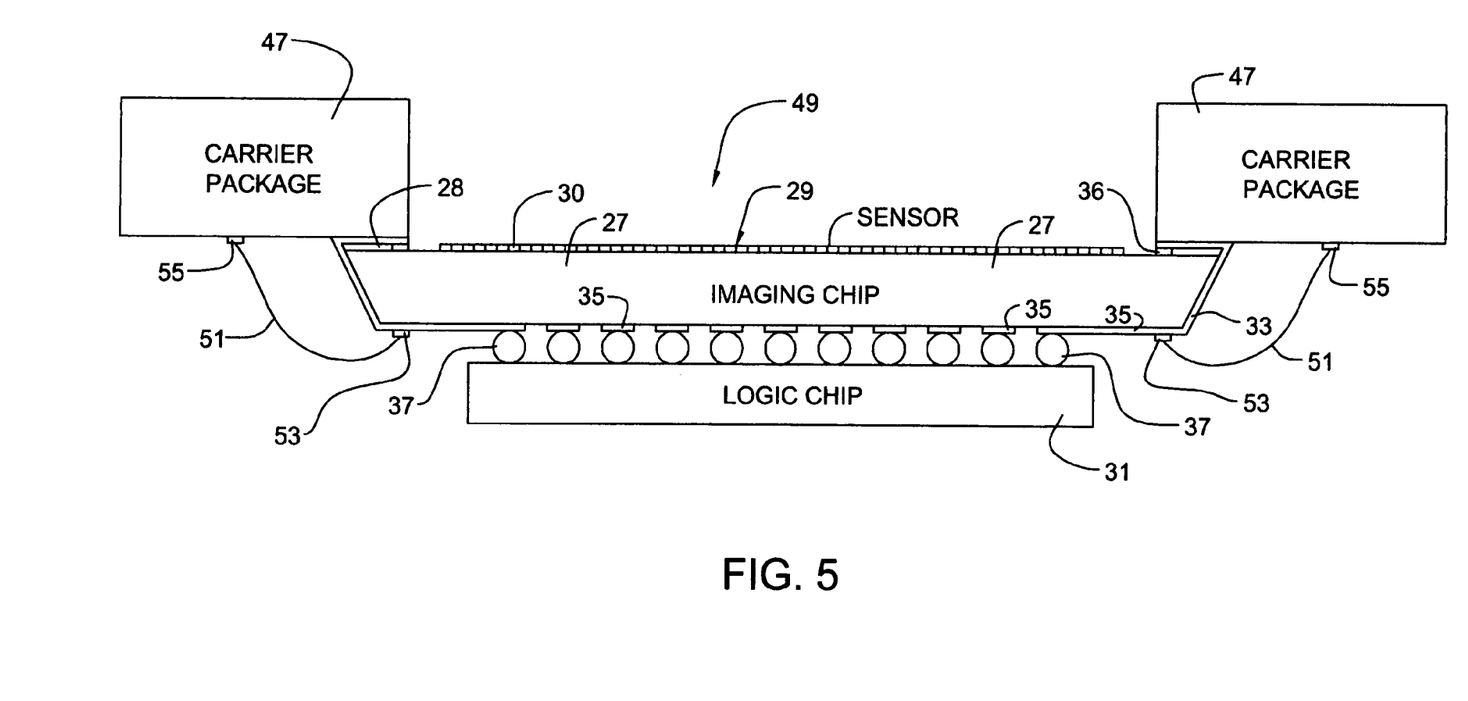
FIG. 5 shows a cross-section of another interconnection and packaging arrangement, in accordance with the present invention.

FIG. 5 shows a cross-section of another interconnection and packaging arrangement, in accordance with the present invention. In this arrangement, imaging chip 27 is attached to carrier package 47 having an opening or aperture 49 for receiving light. The chip is mounted so as to bridge aperture 49 in a manner that allows sensing layer 29 to be exposed to receive light. As understood by those skilled in the art, imaging chip 27 may be attached to by any of a variety of ways. For example, imaging chip 27 may be attached to carrier 47 by an insulating adhesive or bonding material. Again, carrier package 47 may be the wall of a cell phone or camera, for example. It is clear that in each of the arrangements shown in FIGS. 3, 5, 6 and 7, that various optical lens, filters and transparent coating arrangements may be used for handling light incident sensor layer 29 and for protecting sensor layer 29.

By attaching the imaging chip/logic chip CSP so as to bridge the aperture 49, the optical system required may readily be positioned in the aperture adjacent sensor layer 29 without the physical constraints of wiring. The around-the-edge conductors, backside metallurgy and BGA's used as interconnections facilitate such an arrangement in a CSP.

Thus, it can be seen in FIG. 5, that imaging chip 27 is interconnected to logic chip 31 in the same around-the-edge manner, as described with reference to FIG. 3. Thus, around-the-edge metallurgy 33 and backside metallurgy 35 connect to solder bumps 37 which, in turn, are bonded to pads (not shown) on the active surface of logic chip 31. However, with chip 27 of the CSP bridging aperture 49, electrical interconnection to the carrier package in this arrangement is made through wire bonding. Thus, wires 51 are bonded at one end to pads 53 on imaging chip 27 and at the other end to pads 55 on carrier package 47. It can be seen that pads 53 are shown extending beyond backside metallurgy 35. This is done to represent the fact that some wires will be connected directly to pads on backside metallurgy 35 for receiving signals from imaging chip 27 while other wires will be connected to pads that are separate from the backside metallurgy and are arranged to receive signals from logic chip 31. Thus, the latter set of pads connect to backside metallurgy that connects to BGAs 37 to receive signals from logic chip 31. One such arrangement, by way of example, is shown by pad 53 in FIG. 4.

Figure 6:
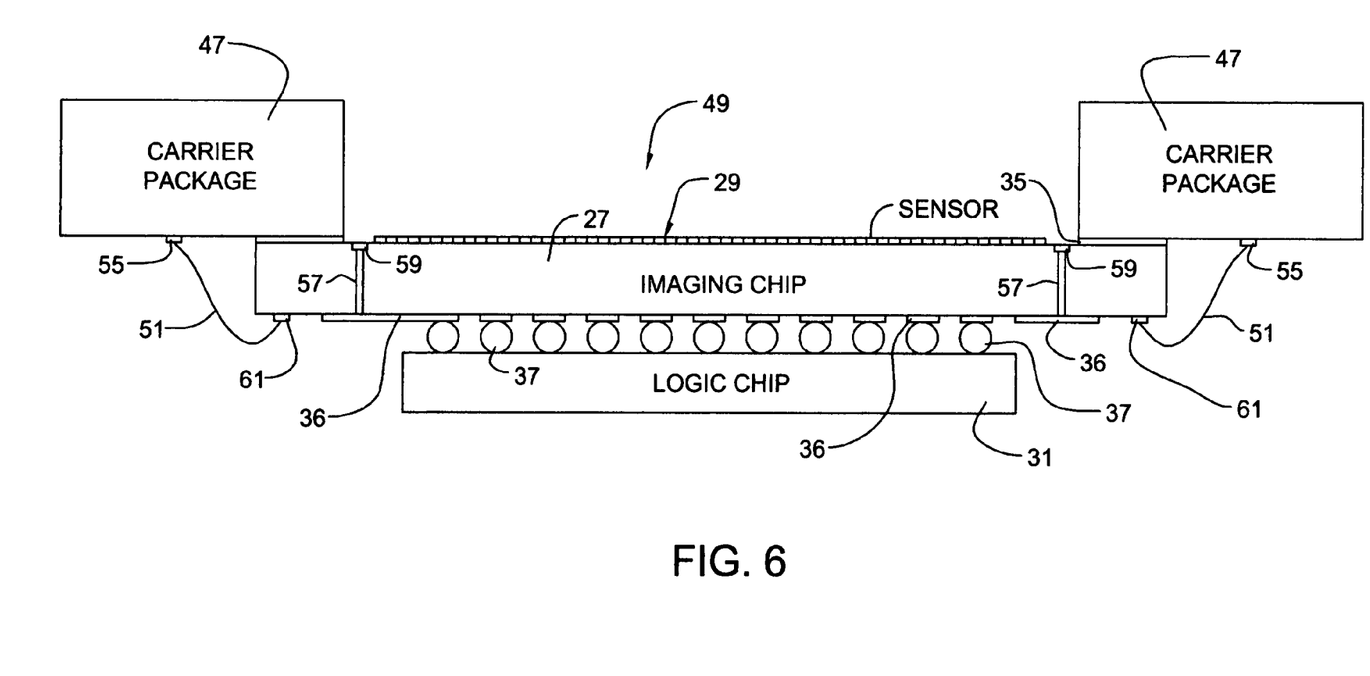
FIG. 6 shows a cross-section of a further interconnection and packaging arrangement, in accordance with the present invention.

FIG. 6 shows another interconnection and packaging arrangement, in accordance with the present invention. As in the arrangement of FIG. 5, imaging chip 27 is mounted on carrier package 47 where carrier package 47 may be a substrate for chip 27 attached to the housing or walls of a cell phone or camera, for example. Alternatively, carrier package 47 may be the housing or wall, itself, of a cell phone or camera.

In the arrangement of FIG. 6, however, the interconnection between imaging chip 27 and logic chip 31 is made using backside metallurgy 36 connected by through via connectors 57 to bond pads 59 on the active surface of imaging chip 27. As shown, the backside metallurgy is connected to logic chip 31 by solder bumps 37. As in FIG. 5, wire bond connectors are used to connect the CSP to carrier package 47. Thus, wire connectors 51 connect pads 55 on carrier package 47 to pads 61 on imaging chip 27. Some pads 61 connect to imaging chip 27 and some connect to logic chip 31.

Figure 7:
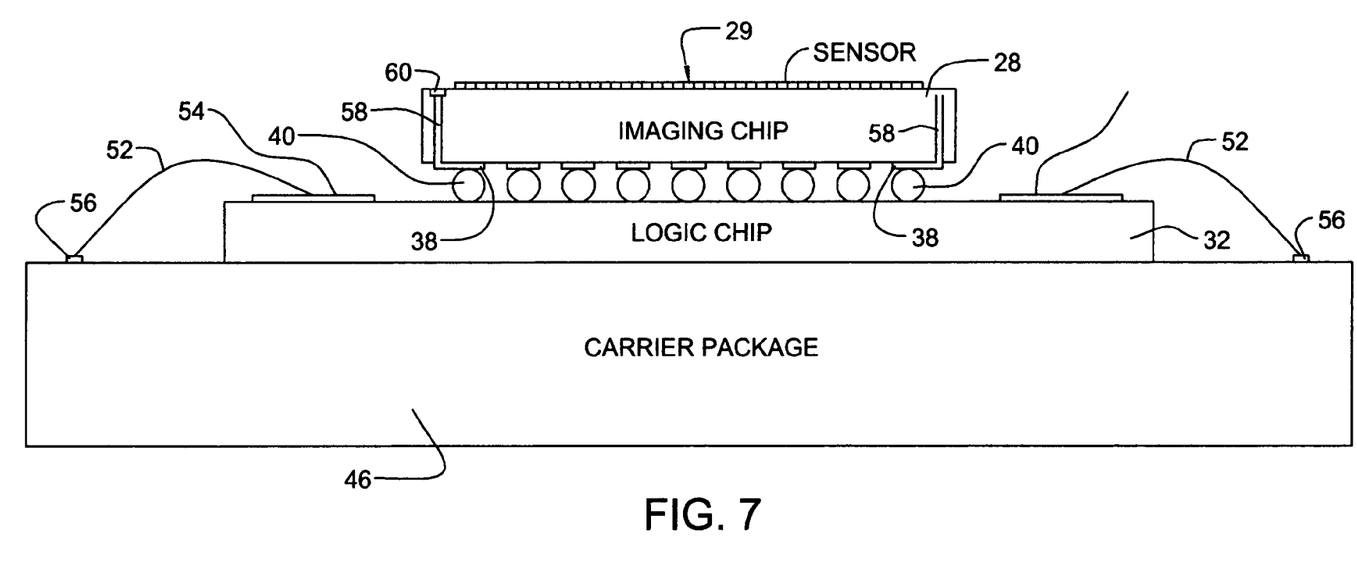
FIG. 7 shows a cross-section of yet another interconnection and packaging arrangement, in accordance with the present invention.

FIG. 7 shows an interconnection and packaging arrangement where logic chip 32 has a larger footprint than imaging chip 28. Backside metallurgy 38 connects pads 60 on the active surface of imaging chip 28 by way of through vias 58, to solder bumps 40. Solder bumps 40, in turn, connect the backside metallurgy 38 to pads (not shown) on logic chip 32. The backside of logic chip 32 is mounted on carrier package 46. Logic chip 32 interconnects to carrier package 46 through wires 52 which are bonded to pads 54 on logic chip 32 and pads 56 on carrier package 46. Although not shown, some of pads 54 connect to imaging chip 28 and others connect to logic chip 32.

It should be understood that in addition to providing a CSP, the around-the-edge or through via conductors, backside metallurgy and BGA arrangements used to interconnect the two chips, also act to provide limited wire-length interconnections. As such, these limited wire lengths reduce the amount of noise that may be generated. This reduction of noise is in addition to that obtained by virtue of separating the logic functions from the imaging functions by using separate chips.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A chip package, comprising:
a first chip having backside metallurgy and pads on an active surface thereof positioned around the peripheral region of said active surface, said backside metallurgy connected to said pads by through via conductors extending through said first chip from said backside metallurgy to said pads; and
a second chip having metallurgy on an active surface thereof connected to the said backside metallurgy of said first chip by an array of interchip solder bumps.

2. A chip package, comprising:
an imaging chip having backside metallurgy and pads on an active surface thereof positioned around the peripheral region of said active surface, said backside metallurgy connected to said pads by conductors extending from said backside metallurgy to said pads; and
a logic chip having metallurgy on an active surface thereof connected to the said backside metallurgy of said imaging chip by an array of interchip solder bumps.

3. The chip package as set forth in claim 2 wherein the said active surface of said imaging chip includes thereon an array of light sensitive pixels located within the position of said pads around said peripheral region with said pixels arranged to generate voltage as a function of light.

4. The chip package as set forth in claim 3 wherein the said imaging chip is mounted across an aperture in the wall of a carrier package so as to expose said array of light sensitive pixels to light through said aperture.

5. The chip package as set forth in claim 4 wherein said imaging chip and said logic chip are electrically connected to said carrier package by wire bonding.

6. The chip package as set forth in claim 5 wherein said conductors are around-the-edge conductors extending conformally around the edge of said imaging chip to said pads.

7. The chip package as set forth in claim 5 wherein said conductors are through via conductors extending through said imaging chip to said pads.

8. The chip package as set forth in claim 3 wherein the backside of said logic chip is mounted on a carrier package.

9. The chip package as set forth in claim 8 wherein said logic chip is electrically connected to said carrier package by wire bonded at one end to pads on said logic chip and the other end to pads on said carrier package.

10. The chip package as set forth in claim 8 wherein said logic chip is electrically connected to said carrier package by an array of solder bumps with some of said solder bumps of said array of solder bumps connected by through vias to selected ones of said interchip solder bumps.

11. The chip package as set forth in claim 3 wherein the planar area of said logic chip is smaller than the planar area of said imaging chip.

* * * * *